United States Patent
Wu et al.

(10) Patent No.: US 7,388,529 B1
(45) Date of Patent: Jun. 17, 2008

(54) INTERFERENCE DETECTION USING A MOVING WINDOW

(75) Inventors: Songping Wu, Sunnyvale, CA (US); Yui Lin, Cupertino, CA (US); Hui-Ling Lou, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 139 days.

(21) Appl. No.: 11/501,338

(22) Filed: Aug. 9, 2006

Related U.S. Application Data

(60) Provisional application No. 60/761,251, filed on Jan. 23, 2006.

(51) Int. Cl.
*H03M 1/62* (2006.01)
*H03M 1/84* (2006.01)

(52) U.S. Cl. ..................... 341/139; 375/345
(58) Field of Classification Search ............... 341/139, 341/143, 155, 132, 118; 375/345, 34, 346; 455/67.13
See application file for complete search history.

(56) References Cited

U.S. PATENT DOCUMENTS

| | | | | |
|---|---|---|---|---|
| 5,930,310 | A | * | 7/1999 | Freeman ..................... 375/346 |
| 6,819,706 | B1 | * | 11/2004 | Lim ............................ 375/130 |
| 6,864,817 | B1 | * | 3/2005 | Salvi et al. .................. 341/139 |

* cited by examiner

*Primary Examiner*—Peguy JeanPierre

(57) ABSTRACT

A system for detecting interference includes an automatic gain control (AGC) module, a digital signal processing (DSP) module, and a control module. The AGC module selectively generates a gain-locked signal when an input signal is received. The DSP module communicates with the AGC module and selectively generates a sync-detect signal when the input signal is received. The control module communicates with the AGC module and the DSP module, and generates a control signal when the DSP module does not generate the sync-detect signal within a predetermined time after the AGC module generates the gain-locked signal.

50 Claims, 14 Drawing Sheets

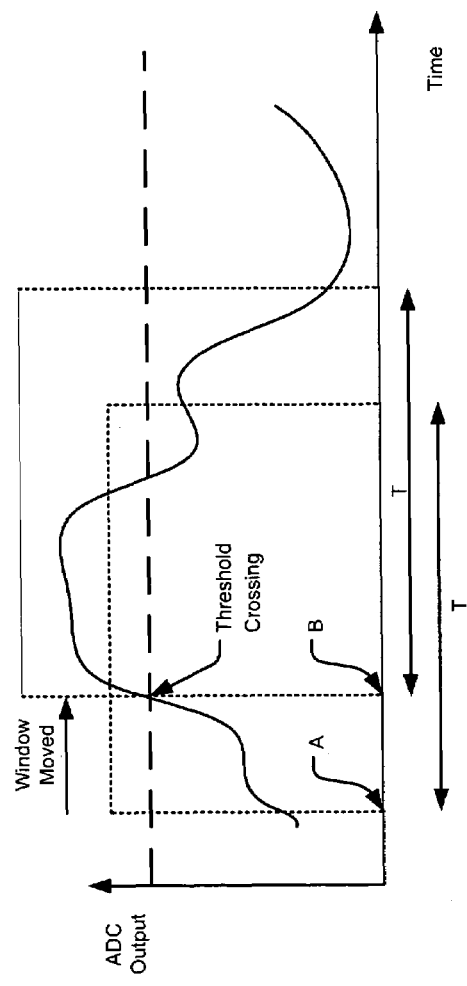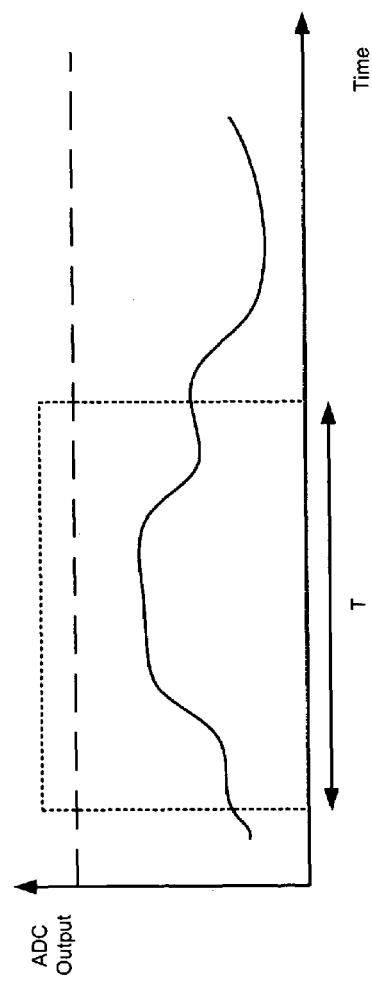

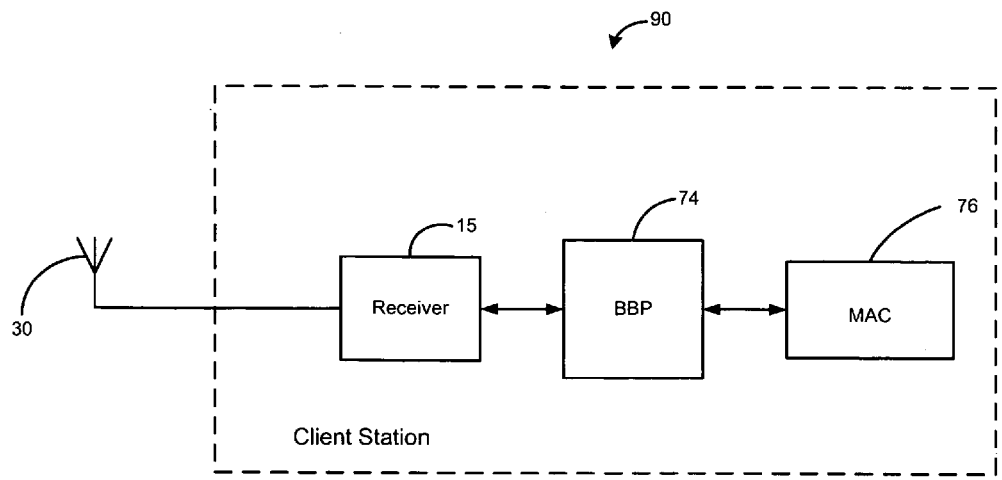
FIG. 6C
FIG. 6D
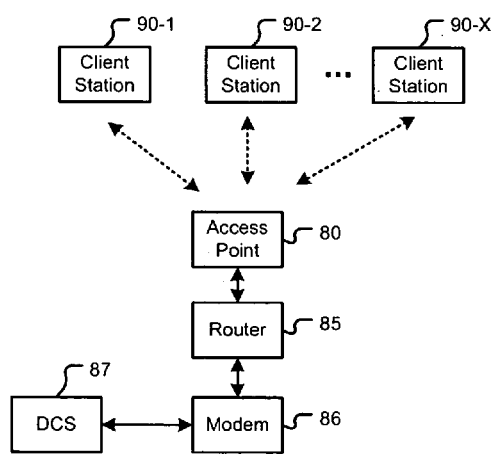
FIG. 6E
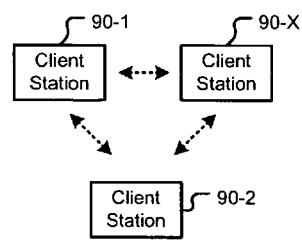

INTERFERENCE DETECTION USING A MOVING WINDOW

CROSS-REFERENCE TO RELATED APPLICATIONS

This application claims the benefit of U.S. Provisional Application No. 60/761,251, filed on Jan. 23, 2006. The disclosure of the above application is incorporated herein by reference in its entirety.

FIELD

The present disclosure relates to communication systems, and more particularly to systems and methods for detecting interference in communication systems.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Communication systems typically comprise transmitters that transmit data over a communication channel and receivers that receive data transmitted by transmitters. Often, receivers receive data that may be corrupted due to co-channel interference (CCI) and/or adjacent channel interference (ACI). CCI may be caused by a signal operating on the same channel that carries data. On the other hand, ACI may be caused by a signal operating in a channel that is adjacent to a channel carrying data.

Interference may distort data. That is, data received by receivers may not represent data transmitted by transmitters due to interference. Consequently, receivers may not accurately interpret and process received data resulting in partial or total data loss. This can degrade system performance and may cause system malfunction.

Referring now to FIGS. 1A-1B, a receiver 10 typically comprises an antenna 30, an automatic gain control (AGC) module 32, a mixer module 33, and a local oscillator module 33-1. The receiver 10 further comprises a filter module 34, an analog-to-digital converter (ADC) module 36, and a digital signal processor (DSP) module 38.

The antenna 30 that receives an input signal. The AGC module 32 has a gain that varies based strength of the input signal. The mixer module 33 mixes a signal generated by the local oscillator module 33-1 with the input signal. The filter module 34 filters an output of the mixer module 33. The ADC module 36 converts an output of the filter module 34 from analog to digital format. The DSP module 38 processes an output of the ADC module 36.

Additionally, the receiver 10 typically comprises a peak detector module 40 that generates a peak-detect signal when the output of the AGC module 32 crosses a predetermined threshold in response to the input signal. The predetermined threshold is generally based on characteristics such as packet size, packet length, strength of the input signal, etc. The peak detector module 40 may generate the peak-detect signal when the AGC module 32 determines that the input signal strength exceeds a relative signal strength index (RSSI).

The peak-detect signal activates the DSP module 38. The DSP module 38 generates a gain-drop signal that drops the gain of the AGC module 32 as shown in FIG. 1B. The gain of the AGC module 32 remains low for the duration of the input signal. The duration of the input signal depends on characteristics such as packet size, packet length, etc. The gain of the AGC module 32 returns to normal at the end of the input signal.

On the other hand, an interference signal may trigger a false alarm. That is, the interference signal may cause the peak detector module 40 to mistake the interference signal as data. The peak detector module 40 may generate the peak-detect signal when the input signal is an interference signal. Subsequently, the DSP module 38 may generate the gain-drop signal that will drop the gain of the AGC module 32. The gain of the AGC module 32, however, may not return to normal since the interference signal may have unknown and/or unknowable characteristics. This can cause system malfunction and/or data loss.

SUMMARY

A system for detecting interference comprises an automatic gain control (AGC) module, a digital signal processing (DSP) module, and a control module. The AGC module selectively generates a gain-locked signal when an input signal is received. The DSP module communicates with the AGC module and selectively generates a sync-detect signal when the input signal is received. The control module communicates with the AGC module and the DSP module, and generates a control signal when the DSP module does not generate the sync-detect signal within a predetermined time after the AGC module generates the gain-locked signal.

In another feature, the AGC module generates the gain-locked signal when a gain of the AGC module stabilizes within a settling time after the input signal is received.

In another feature, the DSP module generates the sync-detect signal when the DSP module detects a synchronization pattern in the input signal.

In another feature, the system further comprises an analog-to-digital converter (ADC) module that communicates with the AGC module and that generates an ADC output that is input to the DSP module and the control module.

In another feature, the control module determines whether the ADC output is greater than a predetermined ADC threshold during the predetermined time using a counter that counts the predetermined time.

In another feature, the control module resets the counter and the counter starts counting the predetermined time again when the ADC output is greater than the predetermined ADC threshold during the predetermined time.

In another feature, the control module determines that the input signal is an interference signal and generates the control signal when the ADC output is less than the predetermined ADC threshold during the predetermined time and when the DSP module does not generate the sync-detect signal during the predetermined time.

In another feature, the control module determines that the input signal is not an interference signal when the ADC output is greater than the predetermined ADC threshold during the predetermined time and when the DSP module generates the sync-detect signal during the predetermined time.

In another feature, the system further comprises a low-pass filter (LPF) module that filters the ADC output and that generates a filtered ADC output that is input to the DSP module and the control module.

In another feature, the control module determines whether the filtered ADC output is greater than a predetermined ADC threshold during the predetermined time using a counter that counts the predetermined time.

In another feature, the control module resets the counter and the counter starts counting the predetermined time again when the filtered ADC output is greater than the predetermined ADC threshold during the predetermined time.

In another feature, the control module determines that the input signal is an interference signal and generates the control signal when the filtered ADC output is less than the predetermined ADC threshold during the predetermined time and when the DSP module does not generate the sync-detect signal during the predetermined time.

In another feature, the control module determines that the input signal is not an interference signal when the filtered ADC output is greater than the predetermined ADC threshold during the predetermined time and when the DSP module generates the sync-detect signal during the predetermined time.

In another feature, the LPF module reduces effects of noise in the system.

In another feature, the control module determines whether the input signal is an interference signal at a speed that is proportional to the predetermined time.

In another feature, the control signal resets the system.

In another feature, the control signal resets at least one of the DSP module and a gain of the AGC module.

In another feature, a receiver comprises the system.

In another feature, a network device comprises the system.

In another feature, an access point comprises the system.

In another feature, a client station comprises the system.

In still other features, a control module for a wireless network device comprises an input module, a comparator module, and a reset module. The input module receives an input and at least one of a gain-locked signal and a sync-detect signal when an input signal is received. The comparator module compares an amplitude of the input to a predetermined threshold when the gain-locked signal is received and the sync-detect signal is not received. The reset module generates a control signal when the amplitude is less than the predetermined threshold during a predetermined time after the gain-locked signal is received and when the input module does not receive the sync-detect signal within the predetermined time.

In another feature, the control module determines that the input signal is an interference signal when the amplitude is less than the predetermined threshold during the predetermined time after the gain-locked signal is received and when the input module does not receive the sync-detect signal within the predetermined time.

In another feature, the input is one of an analog signal, a digital signal, and a filtered signal that is generated in response to the input signal.

In another feature, the control module further comprises a counter that starts counting the predetermined time when the comparator module begins comparing the amplitude.

In another feature, the reset module resets the counter and the counter starts counting the predetermined time again when the amplitude is greater than the predetermined threshold within the predetermined time.

In another feature, the control signal resets the wireless network device.

In still other features, a method for detecting interference comprises selectively generating a gain-locked signal when an input signal is received, selectively generating a sync-detect signal when the input signal is received, and generating a control signal when the sync-detect signal is not generated within a predetermined time after the gain-locked signal is generated.

In another feature, the method further comprises generating the gain-locked signal when a gain of an AGC module stabilizes within a settling time after the input signal is received.

In another feature, the method further comprises detecting a synchronization pattern in the input signal and generating the sync-detect signal when the synchronization pattern is detected in the input signal.

In another feature, the method further comprises converting the input signal from an analog to a digital format and generating an output.

In another feature, the method further comprises counting a predetermined time and determining whether the output is greater than a predetermined threshold during the predetermined time.

In another feature, the method further comprises counting the predetermined time again when the output is greater than the predetermined threshold during the predetermined time.

In another feature, the method further comprises determining that the input signal is an interference signal and generating the control signal when the output is less than the predetermined threshold during the predetermined time and when the sync-detect signal is not generated during the predetermined time.

In another feature, the method further comprises determining that the input signal is not an interference signal when the output is greater than the predetermined threshold during the predetermined time and when the sync-detect signal is generated during the predetermined time.

In another feature, the method further comprises filtering the output and generating a filtered output.

In another feature, the method further comprises counting the predetermined time and determining whether the filtered output is greater than a predetermined threshold during the predetermined time.

In another feature, the method further comprises counting the predetermined time again when the filtered output is greater than the predetermined threshold during the predetermined time.

In another feature, the method further comprises determining that the input signal is an interference signal and generating the control signal when the filtered output is less than the predetermined threshold during the predetermined time and when the sync-detect signal is not generated during the predetermined time.

In another feature, the method further comprises determining that the input signal is not an interference signal when the filtered output is greater than the predetermined threshold during the predetermined time and when the sync-detect signal is generated during the predetermined time.

In another feature, the filtering reduces effects of noise.

In another feature, the method further comprises determining whether the input signal is an interference signal at a speed that is proportional to the predetermined time.

In another feature, the method further comprises resetting a system using the control signal.

In another feature, the method further comprises resetting at least one of a module that generates the sync-detect signal and a gain of an AGC module that generates the gain-locked signal.

In still other features, a method comprises receiving an input and at least one of a gain-locked signal and a sync-detect signal when an input signal is received, comparing an amplitude of the input to a predetermined threshold when the gain-locked signal is received and the sync-detect signal is not received, and generating a control signal when the amplitude is less than the predetermined threshold during a predetermined time after the gain-locked signal is received and when the sync-detect signal is not received within the predetermined time.

In another feature, the method further comprises determining that the input signal is an interference signal when the amplitude is less than the predetermined threshold during the predetermined time after the gain-locked signal is received and when the sync-detect signal is not received within the predetermined time.

In another feature, the input is one of an analog signal, a digital signal, and a filtered signal that is generated in response to the input signal.

In another feature, the method further comprises starting a count of the predetermined time when a comparison of the amplitude begins.

In another feature, the method further comprises resetting the count and starting the count of the predetermined time again when the amplitude is greater than the predetermined threshold within the predetermined time.

In another feature, the method further comprises resetting a wireless network device using the control signal.

In still other features, a system for detecting interference comprises automatic gain control (AGC) means for selectively generating a gain-locked signal when an input signal is received. The system comprises digital signal processing (DSP) means for communicating with the AGC means and for selectively generating a sync-detect signal when the input signal is received. The system further comprises control means for communicating with the AGC means and the DSP means, and for generating a control signal when the DSP means does not generate the sync-detect signal within a predetermined time after the AGC means generates the gain-locked signal.

In another feature, the AGC means generates the gain-locked signal when a gain of the AGC means stabilizes within a settling time after the input signal is received.

In another feature, the DSP means generates the sync-detect signal when the DSP means detects a synchronization pattern in the input signal.

In another feature, the system further comprises analog-to-digital converter (ADC) means for communicating with the AGC means and for generating an ADC output that is input to the DSP means and the control means.

In another feature, the control means determines whether the ADC output is greater than a predetermined ADC threshold during the predetermined time using counter means for counting the predetermined time.

In another feature, the control means resets the counter means and the counter means starts counting the predetermined time again when the ADC output is greater than the predetermined ADC threshold during the predetermined time.

In another feature, the control means determines that the input signal is an interference signal and generates the control signal when the ADC output is less than the predetermined ADC threshold during the predetermined time and when the DSP means does not generate the sync-detect signal during the predetermined time.

In another feature, the control means determines that the input signal is not an interference signal when the ADC output is greater than the predetermined ADC threshold during the predetermined time and when the DSP means generates the sync-detect signal during the predetermined time.

In another feature, the system further comprises low-pass filter (LPF) means for filtering the ADC output and for generating a filtered ADC output that is input to the DSP means and the control means.

In another feature, the control means determines whether the filtered ADC output is greater than a predetermined ADC threshold during the predetermined time using counter means for counting the predetermined time.

In another feature, the control means resets the counter means and the counter means starts counting the predetermined time again when the filtered ADC output is greater than the predetermined ADC threshold during the predetermined time.

In another feature, the control means determines that the input signal is an interference signal and generates the control signal when the filtered ADC output is less than the predetermined ADC threshold during the predetermined time and when the DSP means does not generate the sync-detect signal during the predetermined time.

In another feature, the control means determines that the input signal is not an interference signal when the filtered ADC output is greater than the predetermined ADC threshold during the predetermined time and when the DSP means generates the sync-detect signal during the predetermined time.

In another feature, the LPF means reduces effects of noise in the system.

In another feature, the control means determines whether the input signal is an interference signal at a speed that is proportional to the predetermined time.

In another feature, the control signal resets the system.

In another feature, the control signal resets at least one of the DSP means and a gain of the AGC means.

In another feature, a receiver comprises the system.

In another feature, a network device comprises the system.

In another feature, an access point comprises the system.

In another feature, a client station comprises the system.

In still other features, a control module for a wireless network device comprises input means for receiving an input and at least one of a gain-locked signal and a sync-detect signal when an input signal is received. The control module comprises comparator means for comparing an amplitude of the input to a predetermined threshold when the gain-locked signal is received and the sync-detect signal is not received. The control module further comprises reset means for generating a control signal when the amplitude is less than the predetermined threshold during a predetermined time after the gain-locked signal is received and when the input means does not receive the sync-detect signal within the predetermined time.

In another feature, the control module determines that the input signal is an interference signal when the amplitude is less than the predetermined threshold during the predetermined time after the gain-locked signal is received and when the input means does not receive the sync-detect signal within the predetermined time.

In another feature, the input is one of an analog signal, a digital signal, and a filtered signal that is generated in response to the input signal.

In another feature, the control module further comprises counter means for starting a count of the predetermined time when the comparator module begins comparing the amplitude.

In another feature, the reset means resets the counter means and the counter means starts counting the predetermined time again when the amplitude is greater than the predetermined threshold within the predetermined time.

In another feature, the control signal resets the wireless network device.

In still other features, a computer program executed by a processor for detecting interference comprises selectively generating a gain-locked signal when an input signal is received, selectively generating a sync-detect signal when the input signal is received, and generating a control signal when the sync-detect signal is not generated within a predetermined time after the gain-locked signal is generated.

In another feature, the computer program further comprises generating the gain-locked signal when a gain of an AGC module stabilizes within a settling time after the input signal is received.

In another feature, the computer program further comprises detecting a synchronization pattern in the input signal and generating the sync-detect signal when the synchronization pattern is detected in the input signal.

In another feature, the computer program further comprises converting the input signal from an analog to a digital format and generating an output.

In another feature, the computer program further comprises counting a predetermined time and determining whether the output is greater than a predetermined threshold during the predetermined time.

In another feature, the computer program further comprises counting the predetermined time again when the output is greater than the predetermined threshold during the predetermined time.

In another feature, the computer program further comprises determining that the input signal is an interference signal and generating the control signal when the output is less than the predetermined threshold during the predetermined time and when the sync-detect signal is not generated during the predetermined time.

In another feature, the computer program further comprises determining that the input signal is not an interference signal when the output is greater than the predetermined threshold during the predetermined time and when the sync-detect signal is generated during the predetermined time.

In another feature, the computer program further comprises filtering the output and generating a filtered output.

In another feature, the computer program further comprises counting the predetermined time and determining whether the filtered output is greater than a predetermined threshold during the predetermined time.

In another feature, the computer program further comprises counting the predetermined time again when the filtered output is greater than the predetermined threshold during the predetermined time.

In another feature, the computer program further comprises determining that the input signal is an interference signal and generating the control signal when the filtered output is less than the predetermined threshold during the predetermined time and when the sync-detect signal is not generated during the predetermined time.

In another feature, the computer program further comprises determining that the input signal is not an interference signal when the filtered output is greater than the predetermined threshold during the predetermined time and when the sync-detect signal is generated during the predetermined time.

In another feature, the filtering reduces effects of noise.

In another feature, the computer program further comprises determining whether the input signal is an interference signal at a speed that is proportional to the predetermined time.

In another feature, the computer program further comprises resetting a system using the control signal.

In another feature, the computer program further comprises resetting at least one of a module that generates the sync-detect signal and a gain of an AGC module that generates the gain-locked signal.

In still other features, a computer program executed by a processor comprises receiving an input and at least one of a gain-locked signal and a sync-detect signal when an input signal is received, comparing an amplitude of the input to a predetermined threshold when the gain-locked signal is received and the sync-detect signal is not received, and generating a control signal when the amplitude is less than the predetermined threshold during a predetermined time after the gain-locked signal is received and when the sync-detect signal is not received within the predetermined time.

In another feature, the computer program further comprises determining that the input signal is an interference signal when the amplitude is less than the predetermined threshold during the predetermined time after the gain-locked signal is received and when the sync-detect signal is not received within the predetermined time.

In another feature, the input is one of an analog signal, a digital signal, and a filtered signal that is generated in response to the input signal.

In another feature, the computer program further comprises starting a count of the predetermined time when a comparison of the amplitude begins.

In another feature, the computer program further comprises resetting the count and starting the count of the predetermined time again when the amplitude is greater than the predetermined threshold within the predetermined time.

In another feature, the computer program further comprises resetting a wireless network device using the control signal.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the invention, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4B and 4C are graphs of output of an ADC module relative to time;

FIG. 6C is a functional block diagram of an exemplary implementation of at least one of the receivers of FIGS. 2A-2B in a client station;

FIG. 6D is a functional block diagram of an exemplary wireless network operating in an infrastructure mode;

FIG. 6E is a functional block diagram of an exemplary wireless network operating in an ad-hoc mode;

DETAILED DESCRIPTION

Figure 1A:
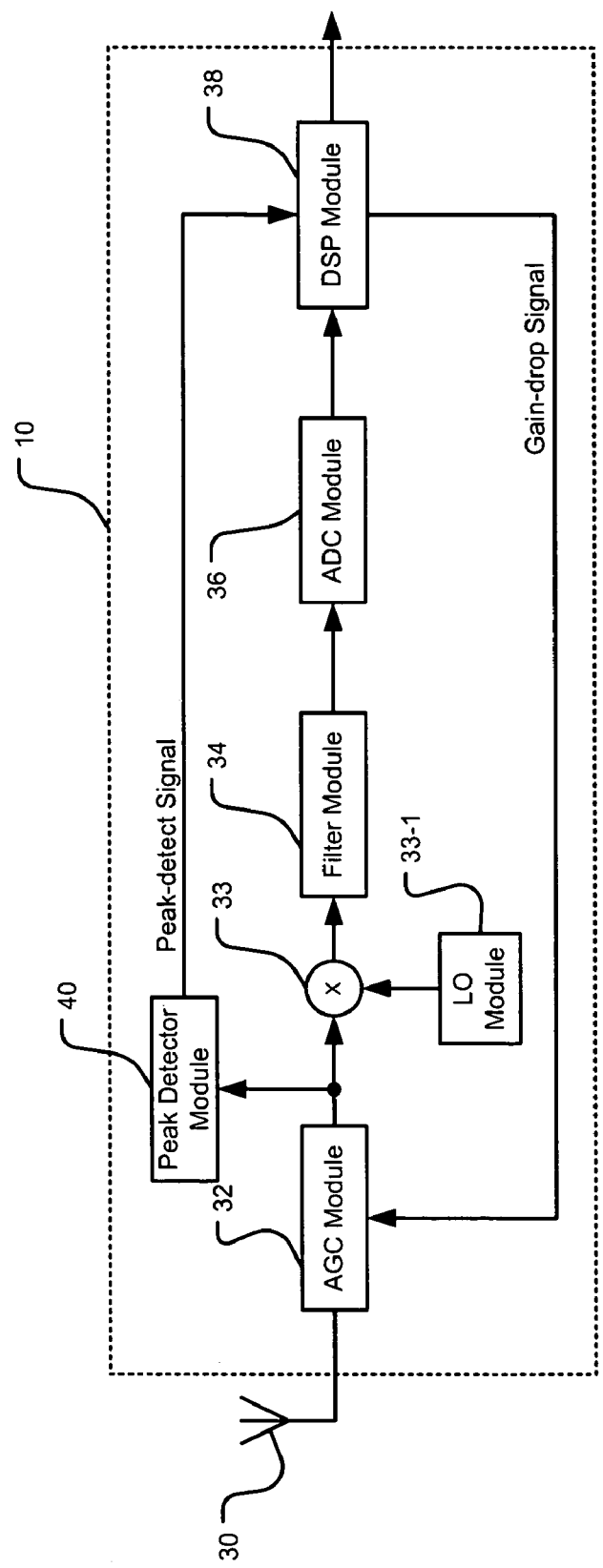
FIG. 1A is a functional block diagram of an exemplary receiver according to the prior art.
Figure 1B:
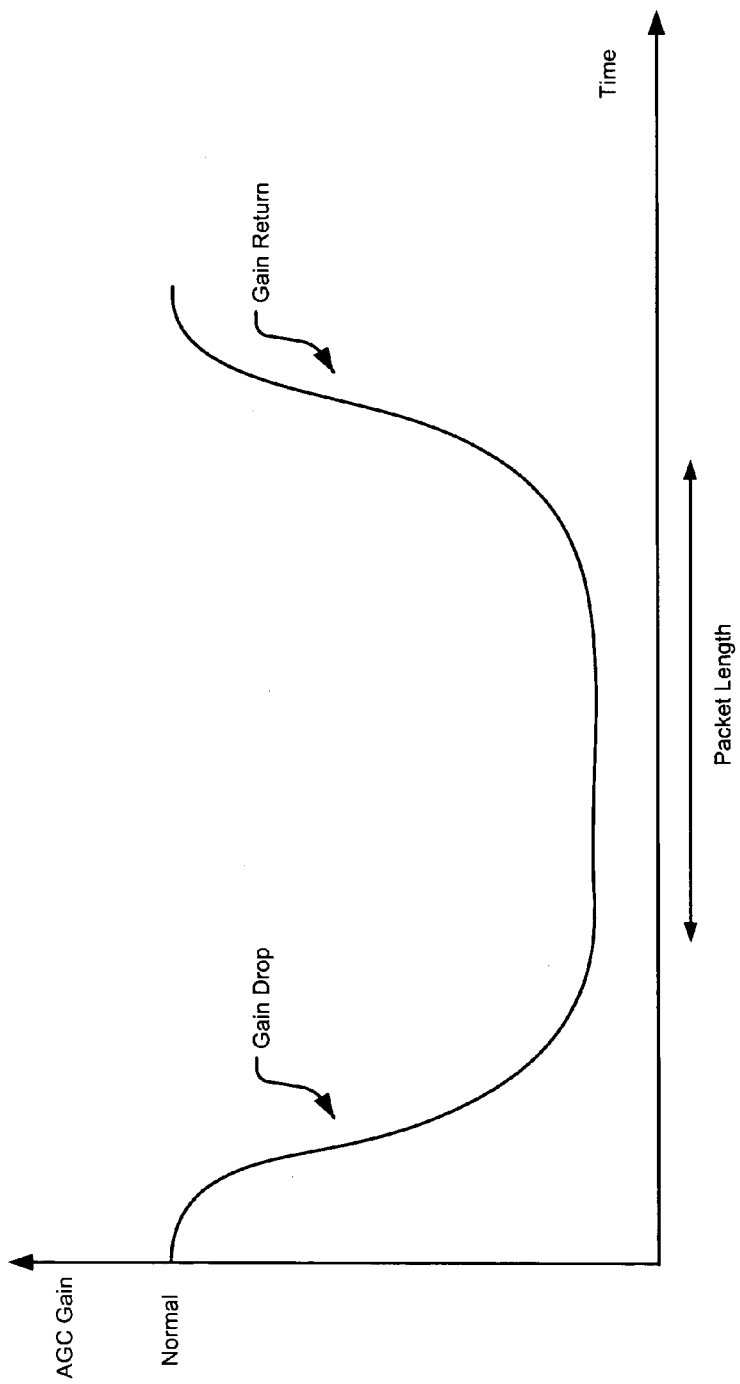
FIG. 1B is an exemplary graph of gain of an automatic gain control (AGC) module relative to time.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 2A:
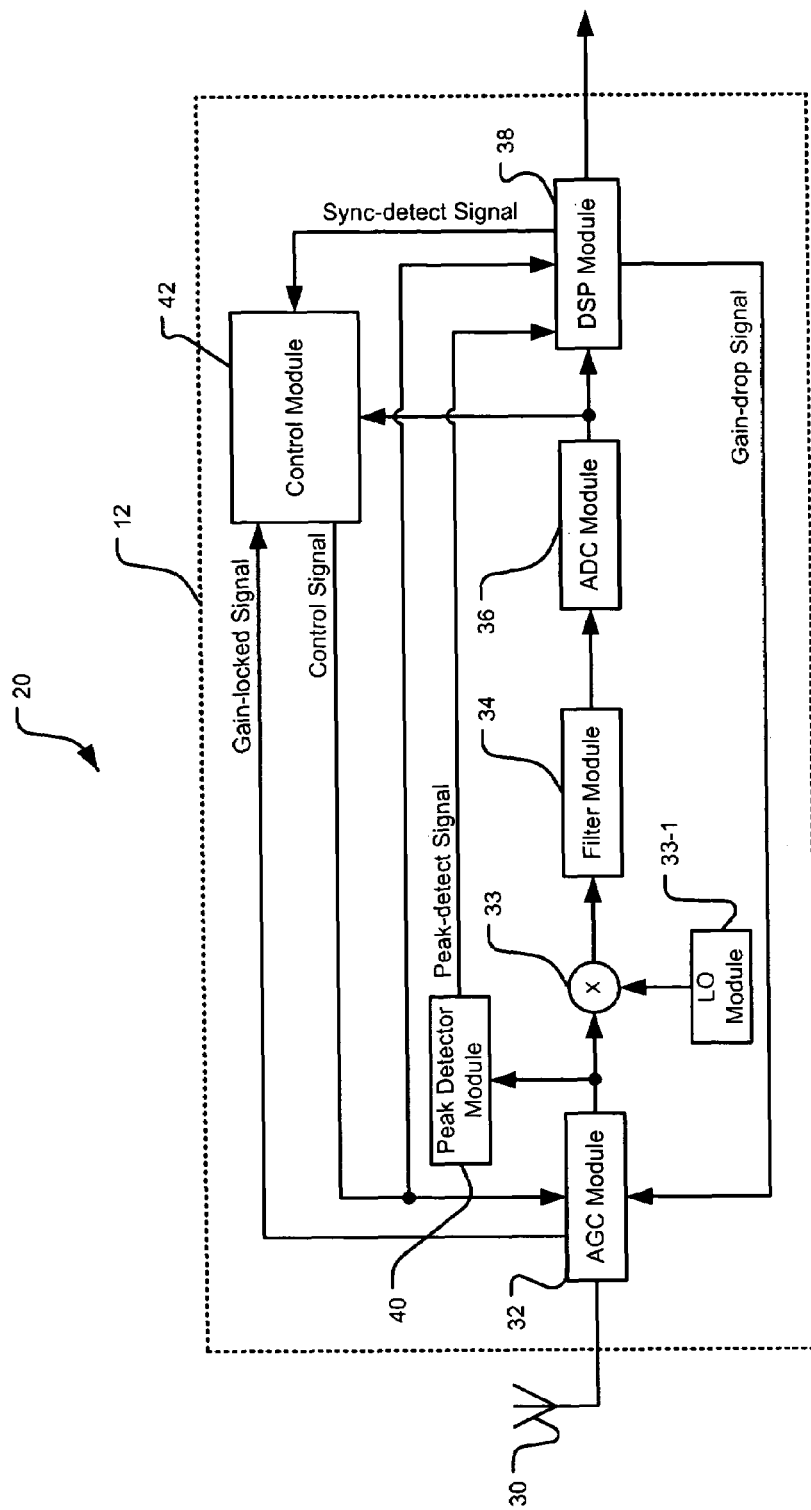
FIG. 2A is a functional block diagram of an exemplary receiver that detects interference according to the present disclosure.
Figure 2B:
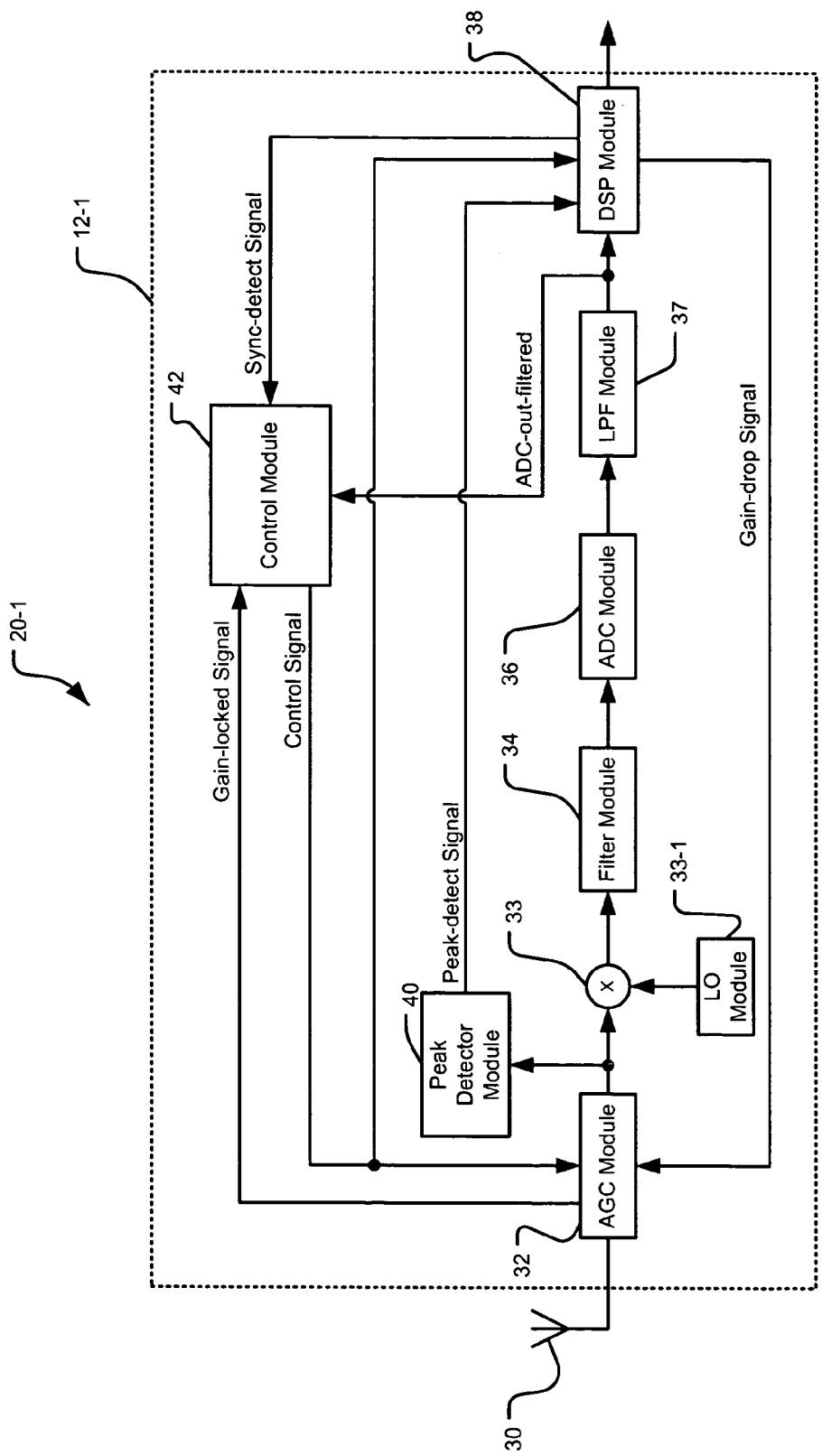
FIG. 2B is a functional block diagram of an exemplary receiver that detects interference according to the present disclosure.

Referring now to FIGS. 2A-2B, a system 20 for detecting interference in a receiver 12 (shown in FIG. 2A) comprises an antenna 30, an automatic gain control (AGC) module 32, a mixer module 33, and a local oscillator module 33-1. The system 20 further comprises a filter module 34, an analog-to-digital converter (ADC) module 36, a digital signal processor (DSP) module 38, a peak detector module 40, and a control module 42.

FIG. 2B shows a system 20-1 for detecting interference in a receiver 12-1. The receiver 12-1 of the system 20-1 comprises all the modules of the receiver 12 of the system 20. Additionally, the receiver 12-1 of the system 20-1 comprises a low-pass filter (LPF) module 37 that filters an output of the ADC module 36 and generates a filtered ADC output shown as an ADC-out-filtered signal in FIG. 2B.

The LPF module 37 inputs the filtered ADC output to the DSP module 38 and to the control module 42. The LPF module 37 reduces effects of noise and reduces a probability of false alarms that may be caused by the noise. False alarms occur when the system 20-1 misinterprets an interference signal as data.

Throughout this disclosure, references to system 20 should be understood as referring to system 20 and system 20-1, references to receiver 12 should be understood as referring to receiver 12 and receiver 12-1, and references to the output of the ADC module 36 should be understood as referring to the output of at least one of the ADC module 36 and the LPF module 37.

Referring now to FIG. 2A, the antenna 30 receives an input signal. The AGC module 32 has a gain that varies based on strength of the input signal. The mixer module 33 mixes a signal generated by the local oscillator module 33-1 with the input signal. The filter module 34 filters an output of the mixer module 33. The ADC module 36 converts an output of the filter module 34 from an analog to a digital format. The DSP module 38 processes the output of the ADC module 36.

The peak detector module 40 generates a peak-detect signal when the output of the AGC module 32 crosses a predetermined threshold in response to the input signal. The predetermined threshold is generally based on characteristics such as packet size, packet length, strength of the input signal, etc. Additionally, the peak detector module 40 may generate the peak-detect signal when the AGC module 32 determines that the signal strength of the input signal exceeds a relative signal strength index (RSSI).

The peak-detect signal activates the DSP module 38. The DSP module 38 generates a gain-drop signal that drops the gain of the AGC module 32. The gain of the AGC module 32 remains low for the duration of the input signal. The duration of the input signal depends on characteristics such as packet size, packet length, etc. The gain of the AGC module 32 returns to normal at the end of the input signal. The DSP module 38 processes a preamble in a packet of data in the input signal and generates a sync-detect signal. When the control module 42 receives the sync-detect signal, the control module 42 sets a sync-detect flag.

Figure 3A:
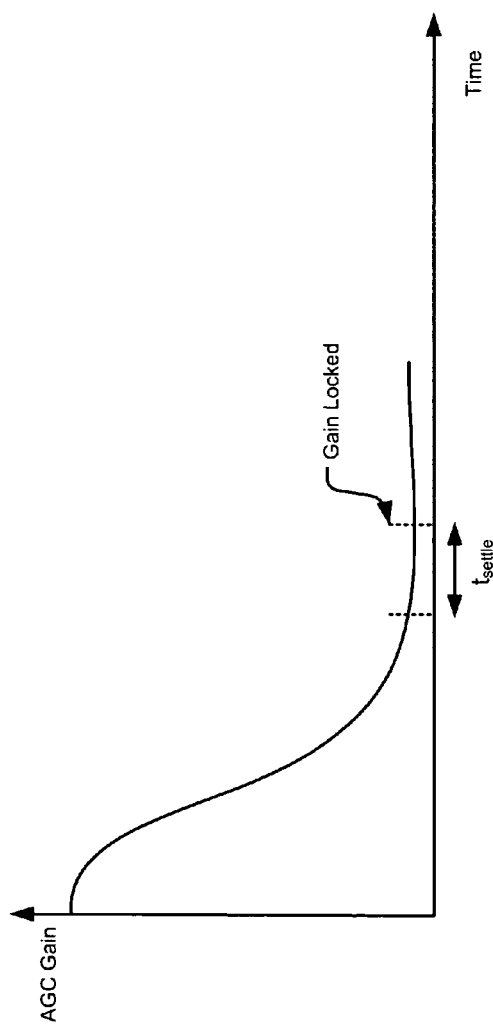
FIG. 3A is a graph of gain of an automatic gain control (AGC) module relative to time.

The control module 42 detects interference and distinguishes interference from data. Referring now to FIG. 3A, after the input signal is received, the gain of the AGC module 32 normally settles down within a predetermined time called a settling time $t_{settle}$. $t_{settle}$ of the AGC module 32 is generally a known design parameter. If the gain of the AGC module 32 settles down within a time that is less than or equal to $t_{settle}$, the AGC module 32 generates a gain-locked signal. When the control module 42 receives the gain-locked signal from the AGC module 32, the control module 42 sets a gain-locked flag.

Figure 3B:
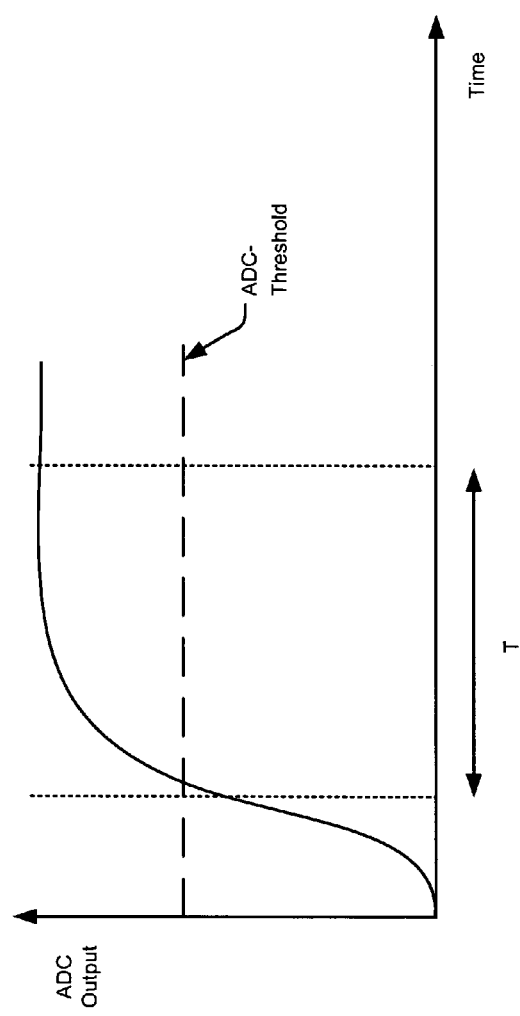
FIG. 3B is a graph of output of an analog-to-digital (ADC) converter module relative to time.

Referring now to FIG. 3B, when the gain-locked flag is set but the sync-detect flag is not set, the control module 42 begins interference detection. The control module 42 monitors the output of the ADC module 36 for a predetermined time T. The control module 42 determines whether the output of the ADC module 36 exceeds a predetermined ADC-threshold during time T. The ADC threshold can be set based on characteristics of the input signal such as packet size, packet length, etc.

Specifically, the control module 42 utilizes a counter or a timer that counts time T. The counter serves as a timing window of duration T. If the ADC-threshold is exceeded within time T, the control module 42 resets the counter. That is, the counter restarts counting time T. In other words, when the counter is reset, the timing window is effectively moved from an initial position to a new position at which the ADC-threshold is exceeded. The control module 42 checks whether the sync-detect flag is set before the time T expires. If the sync-detect flag is set, the control module 42 determines that the input signal is data instead of interference.

On the other hand, if the control module 42 finds after the time T has expired that the sync-detect flag is not set, the control module 42 determines that the input signal is interference instead of data. The control module 42 generates a control signal that resets the receiver 12. Specifically, the control signal resets the DSP module 38 and/or the gain of the AGC module 32. Additionally, the control module 42 resets the gain-locked flag. Thus, the AGC module 32 can respond to subsequent input signals that the receiver 12 may receive.

The control module 42 thus prevents a malfunction of the receiver 12 that may be caused by the interference. The control module 42 prevents subsequent data loss by resetting the gain of the AGC module 32 when the input signal is interference instead of data. The time T can be tailored to increase or decrease the speed of interference detection. Additionally, using a combination of the gain-locked signal and the sync-detect signal decreases a rate of false alarms and increases a probability of interference detection.

Figure 3C:
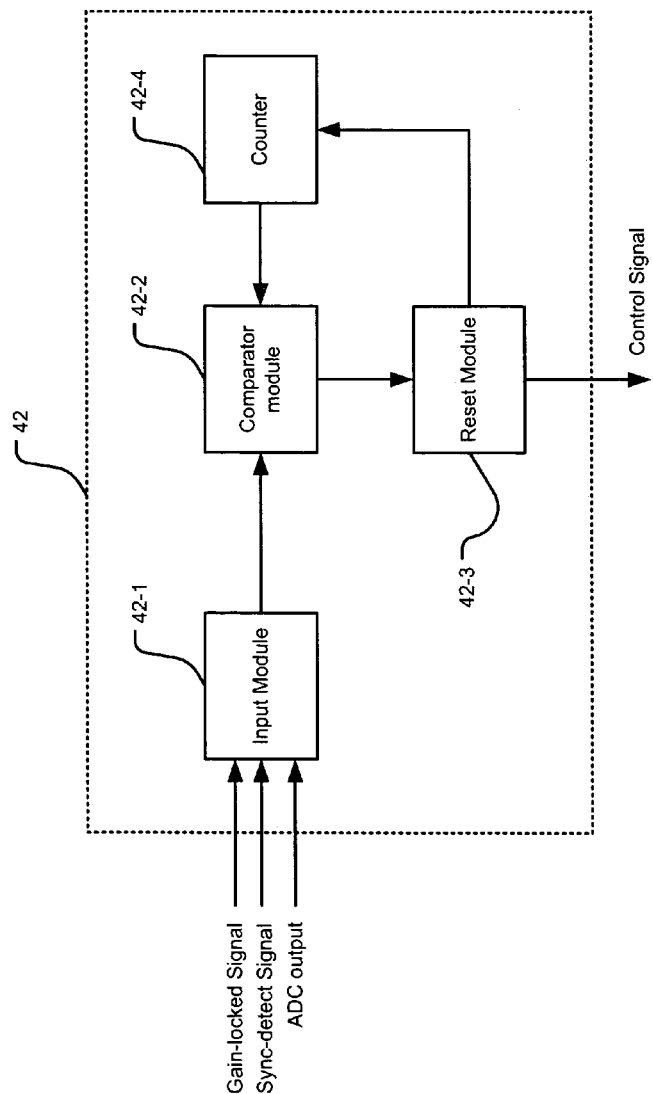
FIG. 3C is a functional block diagram of a control module for the receiver of FIGS. 2A and 2B.

Referring now to FIG. 3C, the control module 42 comprises an input module 42-1, a comparator module 42-2, a reset module 42-3, and a counter 42-4. The input module 42-1 receives an input that is the output of the ADC module 36 or the LPF module 37. Additionally, the input module 42-1 receives the gain-locked signal and the sync-detect signal. The comparator module 42-2 compares the amplitude of the input to the ADC-threshold when the input module 42-1 receives the gain-locked signal but does not receive the sync-detect signal. The counter 42-4 starts counting the predetermined time T when the comparator module 42-2 begins comparing the amplitude.

If the amplitude exceeds the ADC-threshold within time T, the reset module 42-3 resets the counter 42-4, and the counter 42-4 begins counting time T afresh. If the input module 42-1 does not receive the sync detect signal within time T (original or fresh count), the control module 42 determines that the input signal is interference instead of data, and the reset module 42-3 generates the control signal. If, however, the input module 42-1 receives the sync detect signal within time T (original or fresh count), the control module 42 determines that the input signal is data instead of interference.

Figure 4A:
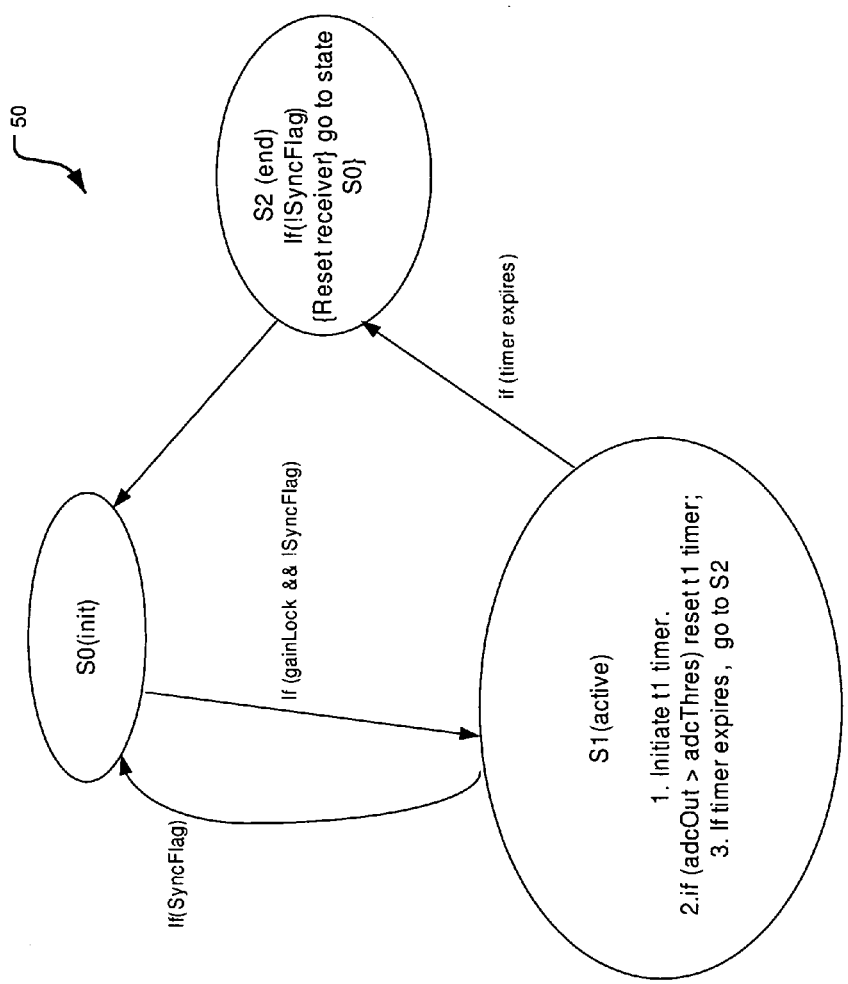
FIG. 4A is a state diagram of a state machine that detects interference in at least one of the receivers of FIGS. 2A-2B according to the present disclosure.

Referring now to FIGS. 4A-4C, a state machine 50 that detects interference comprises three states: an initial or inactive state S0, a monitoring or active state S1, and an end state S2. The state machine 50 is in the initial state when the gain-locked flag and the sync-detect flag are set. When the control module 42 finds that the gain-locked flag is set but the sync-detect flag is not set, the state machine 50 transitions from state S0 to state S1.

In state S1, the control module 42 initializes a counter that counts a predetermined time T. The counter functions as a timing window of time duration T. During the timing window, the control module 42 monitors the output of the ADC module 36. If the output of the ADC module 36 exceeds the ADC-threshold before time T expires, the control module 42 resets the counter, and the counter begins to count time T afresh.

As shown in FIG. 4B, this is equivalent to moving the timing window from an initial position A to a new position B wherein the new position B is a point in time at which the output of the ADC module 36 exceeds the ADC-threshold. On the other hand, the output of the ADC module 36 may not exceed during the time T as shown in FIG. 4C. In that case, the timing window is not moved. That is, the counter is not reset.

While the counter counts the time T afresh (or the original time T if the ADC-threshold is not exceeded), the control module 42 checks whether the sync-detect flag is set before the time T expires. If the control module 42 finds that the sync-detect flag is set before the time T expires, the control module 42 determines that the DSP module 38 generated the sync-detect signal based on a valid data packet and that the input signal is not an interference signal. The state machine 50 returns to state S0.

If, however, the control module 42 finds that the time T has expired and the sync-detect flag is not set after the time T has expired, the state machine 50 transitions to state S2. The control module 42 determines that the input signal is interference instead of data. The control module 42 generates a control signal that resets the receiver 12. Specifically, the control signal resets the DSP module 38 and/or the gain of the AGC module 32. Additionally, the control module 42 resets the gain-locked flag. The state machine 50 transitions to state S0.

Figure 5:
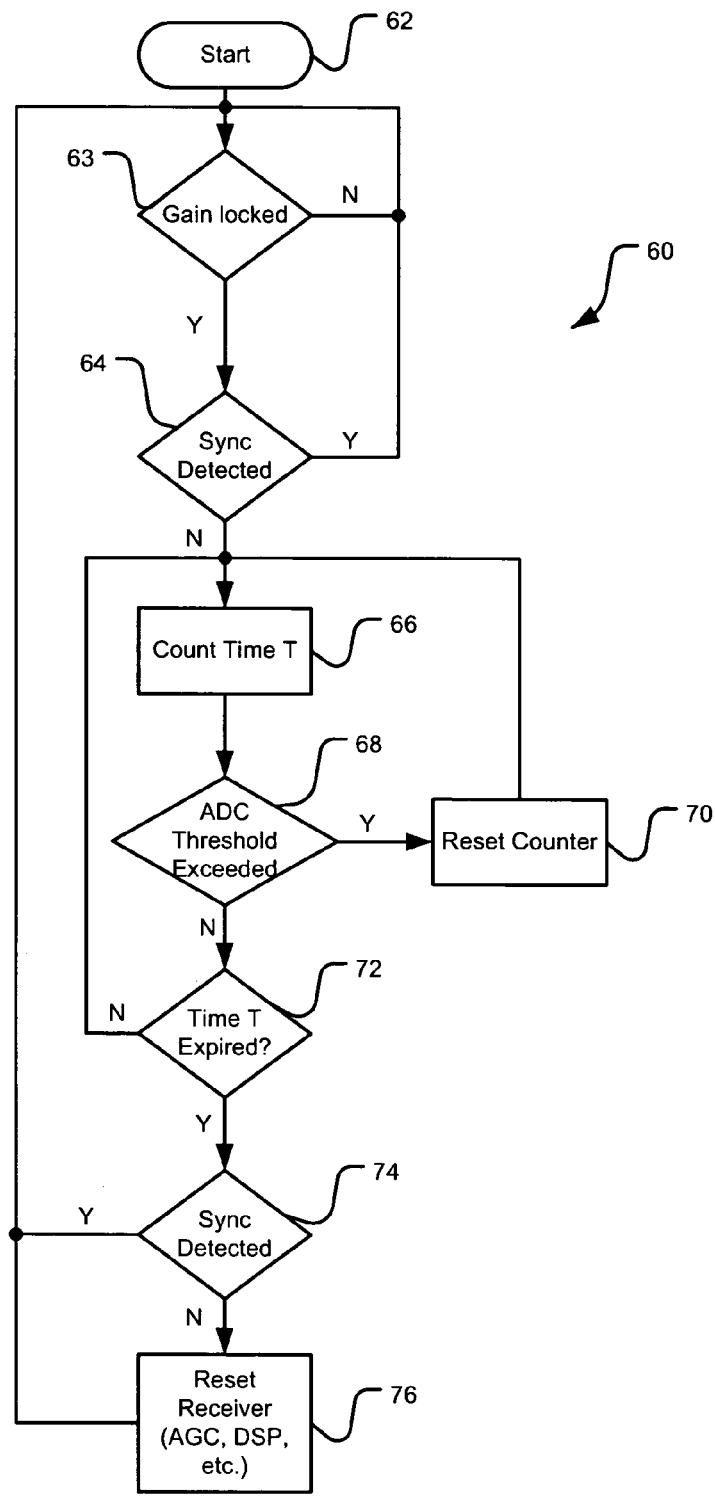
FIG. 5 is a flowchart of a method for detecting interference according to the present disclosure.

Referring now to FIG. 5, a method 60 for detecting interference begins at step 62. The control module 42 checks in step 63 whether the gain-locked flag is set. If false, the method 60 returns to step 62. If true, the control module 42 checks in step 64 whether the sync-detect flag is set. If true, the control module determines that the input signal is data instead of interference, and the method 60 returns to step 62.

If false, the control module 42 starts a counter in step 66 that counts time T. The control module 42 checks in step 68 whether the output of the ADC module 36 exceeds a predetermined ADC-threshold. If true, the control module 42 resets the counter in step 70, and the method 60 returns to step 66. If false, the control module checks in step 72 if the time T expired. If false, the method 60 returns to step 66. If true, the control module 42 checks in step 74 if the sync-detect flag is set. If true, control module 42 determines that the input signal is data instead of interference, and the method 60 returns to step 62. If false, the control module 42 determines that the input signal is interference instead of data and generates a control signal that resets the receiver 12 by resetting the DSP module 38 and/or the gain of the AGC module 32 including the gain-locked flag in step 76. The method 60 returns to step 62.

Figure 6A:
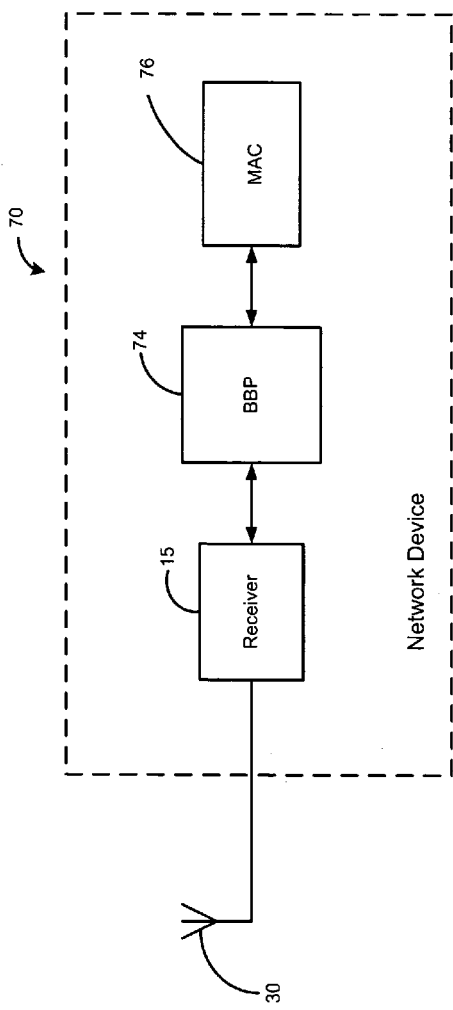
FIG. 6A is a functional block diagram of an exemplary implementation of at least one of the receivers of FIGS. 2A-2B in a wireless network device.
Figure 6B:
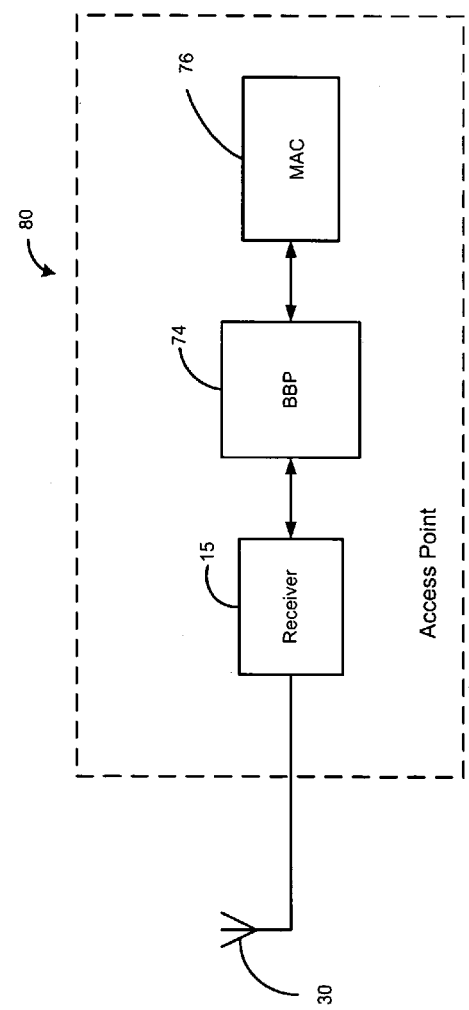
FIG. 6B is a functional block diagram of an exemplary implementation of at least one of the receivers of FIGS. 2A-2B in an access point.

Referring now to FIGS. 6A-6E, various exemplary implementations of the receiver module 15 are shown. FIG. 6A shows an exemplary implementation of the receiver module 15 in a wireless network device 70. In some implementations, some modules of the receiver module 15 may be implemented in a baseband processor (BBP) 74 while some other modules of the receiver module 15 may be implemented in a medium access controller (MAC) 76 of the wireless network device 70. FIGS. 6B-6C show exemplary implementations of the receiver module 15 in a wireless access point 80 and a wireless client station 90, respectively.

In FIG. 6D, an infrastructure network is shown with wireless client stations 90-1, 90-2, . . . , and 90-X that communicate with an access point 80. The access point 80 may communicate with a router 85. A modem 86 may provide access to a distributed communications system (DCS) 87 such as the Internet, a wide area network (WAN), and/or a local area network (LAN). In FIG. 6E, the client stations 90-1, 90-2, . . . , and 90-X are configured in an ad hoc mode.

Figure 7B:
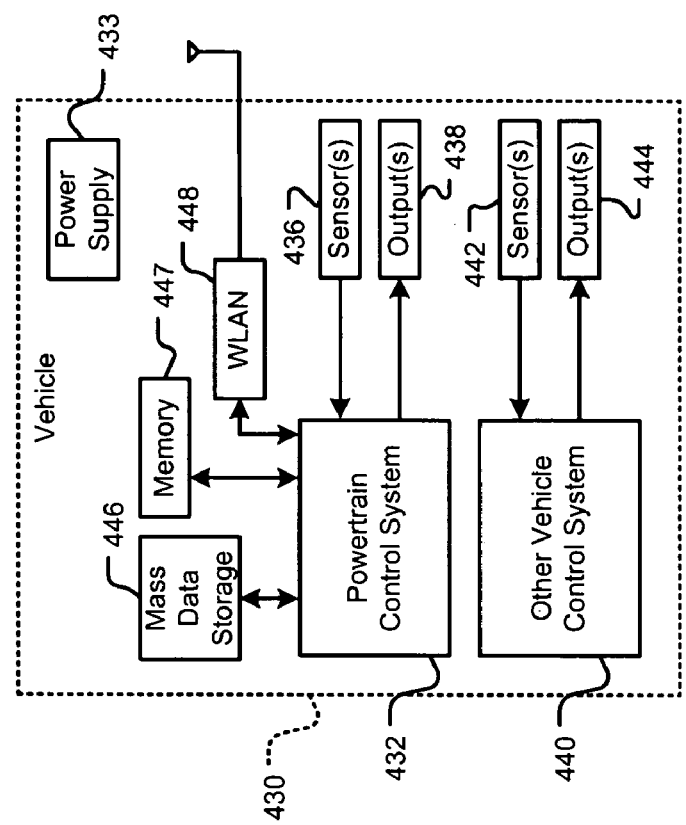
FIG. 7B is a functional block diagram of a vehicle control system.
Figure 7A:
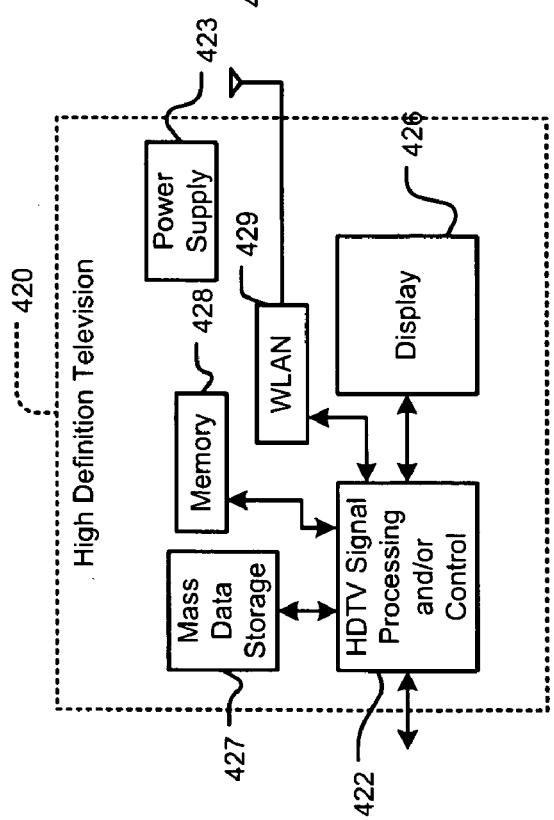
FIG. 7A is a functional block diagram of a high definition television.

Referring now to FIGS. 7A-7E, various exemplary implementations of the system 20 are shown. Referring now to FIG. 7A, the system 20 can be implemented in a WLAN network interface 429 of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via the WLAN network interface 429.

Referring now to FIG. 7B, the system 20 may be implemented in a WLAN network interface 448 of a control system of a vehicle 430. In some implementations, a powertrain control system 432 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

Another control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via the WLAN network interface 448. The control system 440 may also include mass data storage, memory and/or a WLAN interface (all not shown).

Figure 7C:
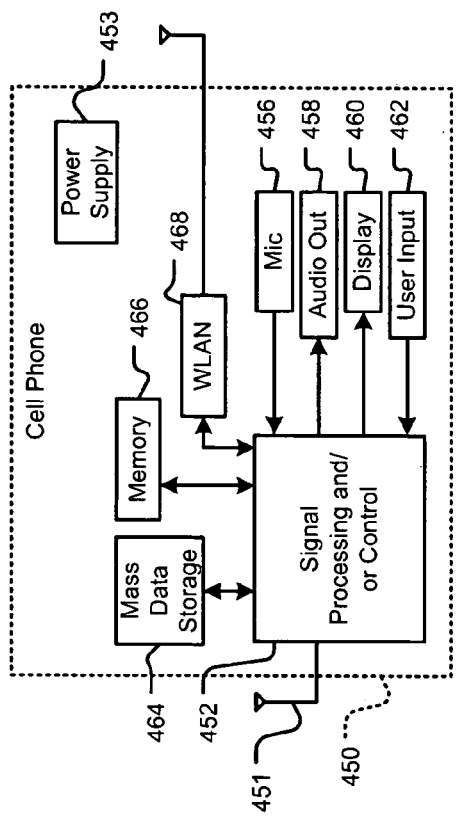
FIG. 7C is a functional block diagram of a cellular phone.

Referring now to FIG. 7C, the system 20 can be implemented in a WLAN network interface 468 of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via the WLAN network interface 468.

Figure 7D:
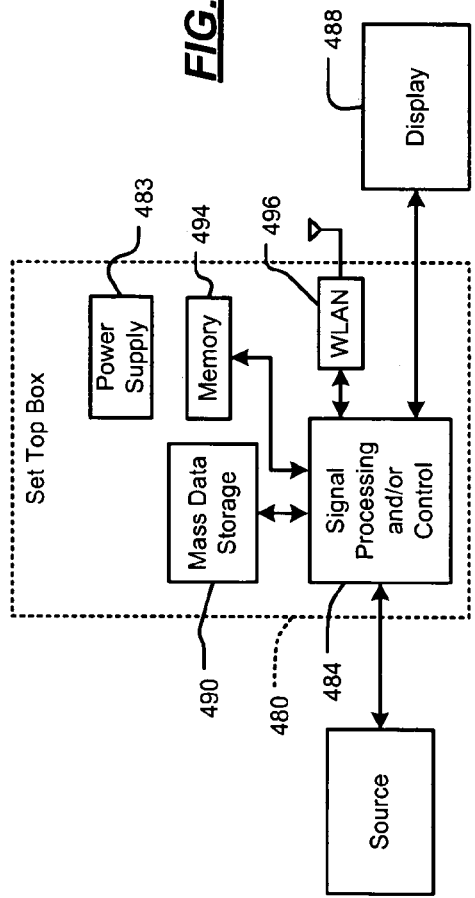
FIG. 7D is a functional block diagram of a set top box.

Referring now to FIG. 7D, the system 20 can be implemented in WLAN network interface 496 of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via the WLAN network interface 496.

Figure 7E:
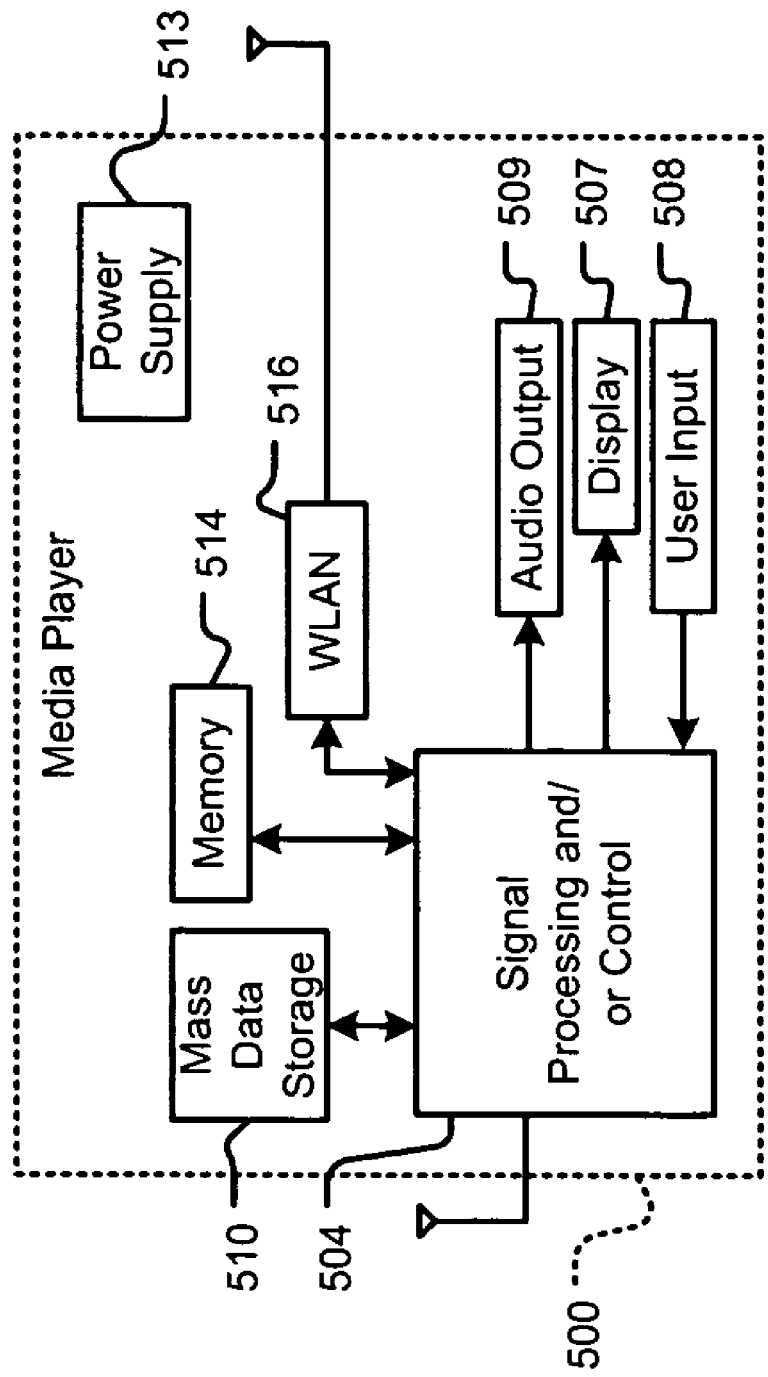
FIG. 7E is a functional block diagram of a media player.

Referring now to FIG. 7E, the system 20 can be implemented in a WLAN network interface 516 of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via the WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system for detecting interference, comprising:
   an automatic gain control (AGC) module that selectively generates a gain-locked signal when an input signal is received;
   a digital signal processing (DSP) module that communicates with said AGC module and that selectively generates a sync-detect signal when said input signal is received; and
   a control module that communicates with said AGC module and said DSP module, and that generates a control signal when said DSP module does not generate said sync-detect signal within a predetermined time after said AGC module generates said gain-locked signal.

2. The system of claim 1 wherein said AGC module generates said gain-locked signal when a gain of said AGC module stabilizes within a settling time after said input signal is received.

3. The system of claim 1 wherein said DSP module generates said sync-detect signal when said DSP module detects a synchronization pattern in said input signal.

4. The system of claim 1 further comprising an analog-to-digital converter (ADC) module that communicates with said AGC module and that generates an ADC output that is input to said DSP module and said control module.

5. The system of claim 4 wherein said control module determines whether said ADC output is greater than a predetermined ADC threshold during said predetermined time using a counter that counts said predetermined time.

6. The system of claim 5 wherein said control module resets said counter and said counter starts counting said predetermined time again when said ADC output is greater than said predetermined ADC threshold during said predetermined time.

7. The system of claim 5 wherein said control module determines that said input signal is an interference signal and generates said control signal when said ADC output is less than said predetermined ADC threshold during said predetermined time and when said DSP module does not generate said sync-detect signal during said predetermined time.

8. The system of claim 5 wherein said control module determines that said input signal is not an interference signal when said ADC output is greater than said predetermined ADC threshold during said predetermined time and when said DSP module generates said sync-detect signal during said predetermined time.

9. The system of claim 4 further comprising a low-pass filter (LPF) module that filters said ADC output and that generates a filtered ADC output that is input to said DSP module and said control module.

10. The system of claim 9 wherein said control module determines whether said filtered ADC output is greater than a predetermined ADC threshold during said predetermined time using a counter that counts said predetermined time.

11. The system of claim 10 wherein said control module resets said counter and said counter starts counting said predetermined time again when said filtered ADC output is greater than said predetermined ADC threshold during said predetermined time.

12. The system of claim 10 wherein said control module determines that said input signal is an interference signal and generates said control signal when said filtered ADC output is less than said predetermined ADC threshold during said predetermined time and when said DSP module does not generate said sync-detect signal during said predetermined time.

13. The system of claim 10 wherein said control module determines that said input signal is not an interference signal when said filtered ADC output is greater than said predetermined ADC threshold during said predetermined time and when said DSP module generates said sync-detect signal during said predetermined time.

14. The system of claim 9 wherein said LPF module reduces effects of noise in said system.

15. The system of claim 1 wherein said control module determines whether said input signal is an interference signal at a speed that is proportional to said predetermined time.

16. The system of claim 1 wherein said control signal resets said system.

17. The system of claim 1 wherein said control signal resets at least one of said DSP module and a gain of said AGC module.

18. A receiver comprising the system of claim 1.

19. A network device comprising the system of claim 1.

20. An access point comprising the system of claim 1.

21. A client station comprising the system of claim 1.

22. A control module for a wireless network device, comprising:
   an input module that receives an input and at least one of a gain-locked signal and a sync-detect signal when an input signal is received;
   a comparator module that compares an amplitude of said input to a predetermined threshold when said gain-locked signal is received and said sync-detect signal is not received; and
   a reset module that generates a control signal when said amplitude is less than said predetermined threshold during a predetermined time after said gain-locked signal is received and when said input module does not receive said sync-detect signal within said predetermined time.

23. The control module of claim 22 determines that said input signal is an interference signal when said amplitude is less than said predetermined threshold during said predetermined time after said gain-locked signal is received and when said input module does not receive said sync-detect signal within said predetermined time.

24. The control module of claim 22 wherein said input is one of an analog signal, a digital signal, and a filtered signal that is generated in response to said input signal.

25. The control module of claim 22 further comprising a counter that starts counting said predetermined time when said comparator module begins comparing said amplitude.

26. The control module of claim 25 wherein said reset module resets said counter and said counter starts counting said predetermined time again when said amplitude is greater than said predetermined threshold within said predetermined time.

27. The control module of claim 22 wherein said control signal resets said wireless network device.

28. A method for detecting interference, comprising:
- selectively generating a gain-locked signal when an input signal is received;
- selectively generating a sync-detect signal when said input signal is received; and
- generating a control signal when said sync-detect signal is not generated within a predetermined time after said gain-locked signal is generated.

29. The method of claim 28 further comprising generating said gain-locked signal when a gain of an AGC module stabilizes within a settling time after said input signal is received.

30. The method of claim 28 further comprising detecting a synchronization pattern in said input signal and generating said sync-detect signal when said synchronization pattern is detected in said input signal.

31. The method of claim 28 further comprising converting said input signal from an analog to a digital format and generating an output.

32. The method of claim 31 further comprising counting a predetermined time and determining whether said output is greater than a predetermined threshold during said predetermined time.

33. The method of claim 32 further comprising counting said predetermined time again when said output is greater than said predetermined threshold during said predetermined time.

34. The method of claim 32 further comprising determining that said input signal is an interference signal and generating said control signal when said output is less than said predetermined threshold during said predetermined time and when said sync-detect signal is not generated during said predetermined time.

35. The method of claim 32 further comprising determining that said input signal is not an interference signal when said output is greater than said predetermined threshold during said predetermined time and when said sync-detect signal is generated during said predetermined time.

36. The method of claim 31 further comprising filtering said output and generating a filtered output.

37. The method of claim 36 further comprising counting said predetermined time and determining whether said filtered output is greater than a predetermined threshold during said predetermined time.

38. The method of claim 37 further comprising counting said predetermined time again when said filtered output is greater than said predetermined threshold during said predetermined time.

39. The method of claim 37 further comprising determining that said input signal is an interference signal and generating said control signal when said filtered output is less than said predetermined threshold during said predetermined time and when said sync-detect signal is not generated during said predetermined time.

40. The method of claim 37 further comprising determining that said input signal is not an interference signal when said filtered output is greater than said predetermined threshold during said predetermined time and when said sync-detect signal is generated during said predetermined time.

41. The method of claim 36 wherein said filtering reduces effects of noise.

42. The method of claim 28 further comprising determining whether said input signal is an interference signal at a speed that is proportional to said predetermined time.

43. The method of claim 28 further comprising resetting a system using said control signal.

44. The method of claim 28 further comprising resetting at least one of a module that generates said sync-detect signal and a gain of an AGC module that generates said gain-locked signal.

45. A method, comprising:
- receiving an input and at least one of a gain-locked signal and a sync-detect signal when an input signal is received;
- comparing an amplitude of said input to a predetermined threshold when said gain-locked signal is received and said sync-detect signal is not received; and
- generating a control signal when said amplitude is less than said predetermined threshold during a predetermined time after said gain-locked signal is received and when said sync-detect signal is not received within said predetermined time.

46. The method of claim 45 further comprising determining that said input signal is an interference signal when said amplitude is less than said predetermined threshold during said predetermined time after said gain-locked signal is received and when said sync-detect signal is not received within said predetermined time.

47. The method of claim 45 wherein said input is one of an analog signal, a digital signal, and a filtered signal that is generated in response to said input signal.

48. The method of claim 45 further comprising starting a count of said predetermined time when a comparison of said amplitude begins.

49. The method of claim 48 further comprising resetting said count and starting said count of said predetermined time again when said amplitude is greater than said predetermined threshold within said predetermined time.

50. The method of claim 45 further comprising resetting a wireless network device using said control signal.

* * * * *